(12) United States Patent
Yoshida et al.

(10) Patent No.: US 12,322,605 B2
(45) Date of Patent: Jun. 3, 2025

(54) SEMICONDUCTOR DEVICE AND METHOD OF MANUFACTURING SEMICONDUCTOR DEVICE

(71) Applicant: Mitsubishi Electric Corporation, Tokyo (JP)

(72) Inventors: Motoru Yoshida, Tokyo (JP); Yuji Sato, Tokyo (JP); Kazuyuki Sugahara, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 384 days.

(21) Appl. No.: 17/791,908

(22) PCT Filed: Apr. 6, 2020

(86) PCT No.: PCT/JP2020/015552
§ 371 (c)(1),
(2) Date: Jul. 11, 2022

(87) PCT Pub. No.: WO2021/205517
PCT Pub. Date: Oct. 14, 2021

(65) Prior Publication Data
US 2023/0047789 A1    Feb. 16, 2023

(51) Int. Cl.
*H01L 21/50* (2006.01)
*H01L 23/00* (2006.01)

(52) U.S. Cl.
CPC .............. *H01L 21/50* (2013.01); *H01L 24/05* (2013.01); *H01L 24/48* (2013.01); *H01L 24/73* (2013.01);
(Continued)

(58) Field of Classification Search
CPC ......... H01L 21/50; H01L 24/05; H01L 24/48; H01L 24/73; H01L 2224/05124;
(Continued)

(56) References Cited

U.S. PATENT DOCUMENTS

| | | |
|---|---|---|
| 2005/0006778 A1 | 1/2005 | Shinyama et al. |
| 2006/0081996 A1 | 4/2006 | Shinyama et al. |
| 2016/0181379 A1 | 6/2016 | Akao |
| 2018/0053737 A1 | 2/2018 | Ogawa et al. |
| 2019/0057873 A1 | 2/2019 | Sugahara et al. |

FOREIGN PATENT DOCUMENTS

| | | |
|---|---|---|
| DE | 102005049575 A1 | 4/2006 |
| DE | 102015224845 A1 | 6/2016 |

(Continued)

OTHER PUBLICATIONS

International Search Report and Written Opinion mailed on Jun. 30, 2020, received for PCT Application PCT/JP2020/015552, filed on Apr. 6, 2020, 9 pages including English Translation.

(Continued)

*Primary Examiner* — Elias Ullah
(74) *Attorney, Agent, or Firm* — XSENSUS LLP

(57) ABSTRACT

Provided is a semiconductor device capable of suppressing an Al slide at a time of an operation under a high temperature in a laminated structure of an aluminum electrode layer and a copper electrode layer. Accordingly, in the semiconductor device according to the present disclosure, a first copper electrode layer includes a plurality of protruding regions as regions protruding toward the aluminum electrode layer in an interface with the aluminum electrode layer.

17 Claims, 16 Drawing Sheets

(52) U.S. Cl.
CPC ............... *H01L 2224/05124* (2013.01); *H01L 2224/05647* (2013.01); *H01L 2224/48491* (2013.01); *H01L 2224/73265* (2013.01)

(58) Field of Classification Search
CPC . H01L 2224/05647; H01L 2224/48491; H01L 2224/73265; H01L 24/03; H01L 24/32; H01L 24/83; H01L 2224/05; H01L 2224/05011; H01L 2224/05017; H01L 2224/05559; H01L 2224/32225; H01L 2224/45124; H01L 2224/45144; H01L 2224/45147; H01L 2224/4847; H01L 2224/83801; H01L 2224/8384

See application file for complete search history.

(56) References Cited

FOREIGN PATENT DOCUMENTS

| | | |
|---|---|---|
| DE | 112017001788 T5 | 12/2018 |
| JP | 2005019829 A | 1/2005 |
| JP | 2005-33131 A | 2/2005 |
| JP | 2006-114827 A | 4/2006 |
| JP | 2018-37684 A | 3/2018 |
| WO | 2016/143557 A1 | 9/2016 |

OTHER PUBLICATIONS

Office Action mailed Sep. 27, 2023, in German Application No. 11 2020 007 026.3, 15 pages.

F I G. 1
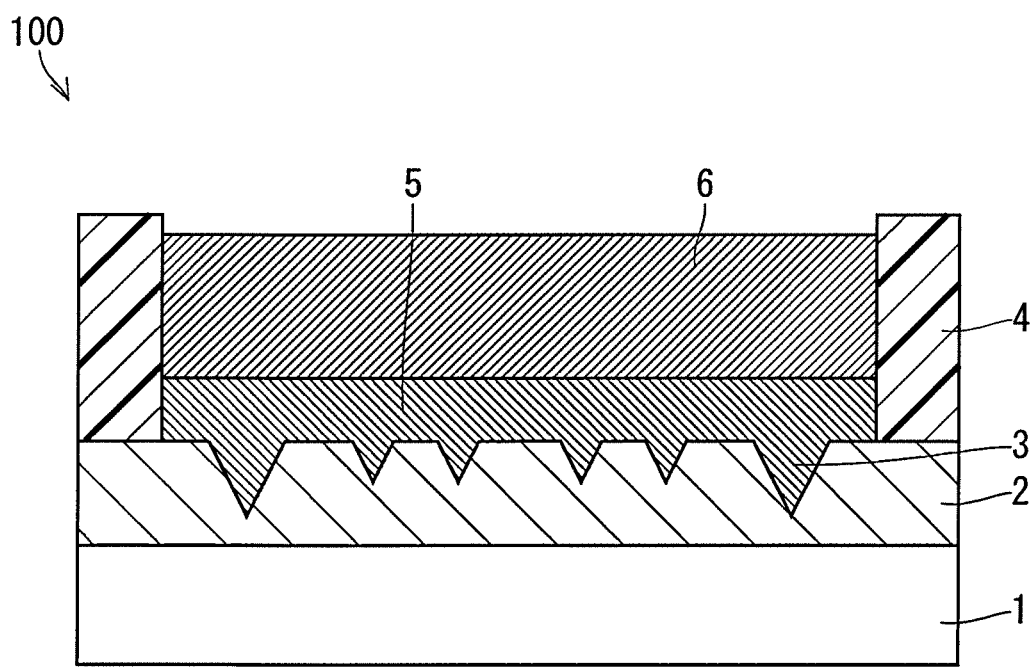

F I G. 3
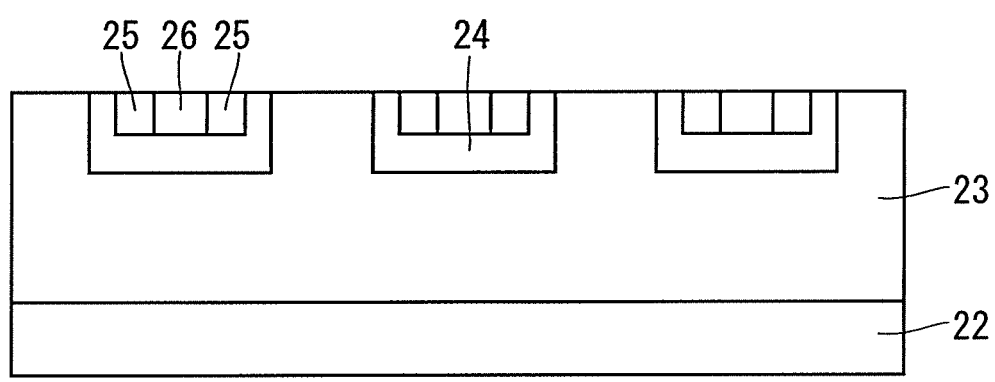

F I G. 6
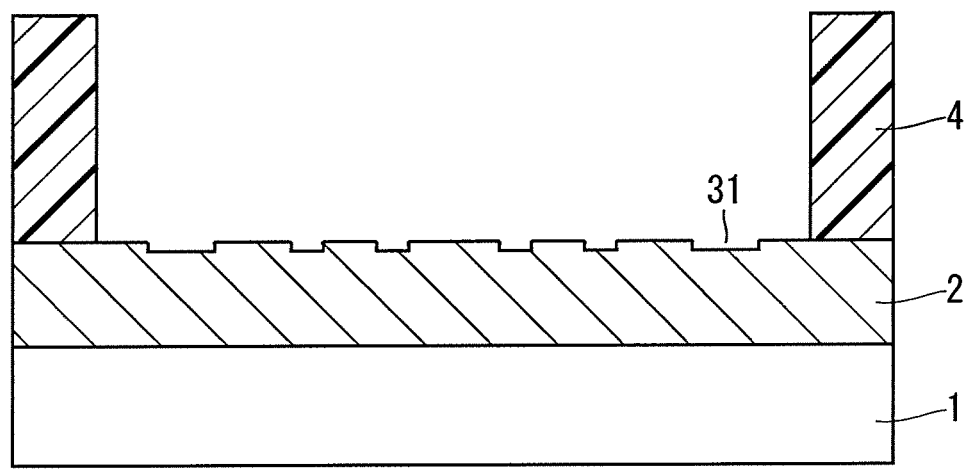

F I G. 7
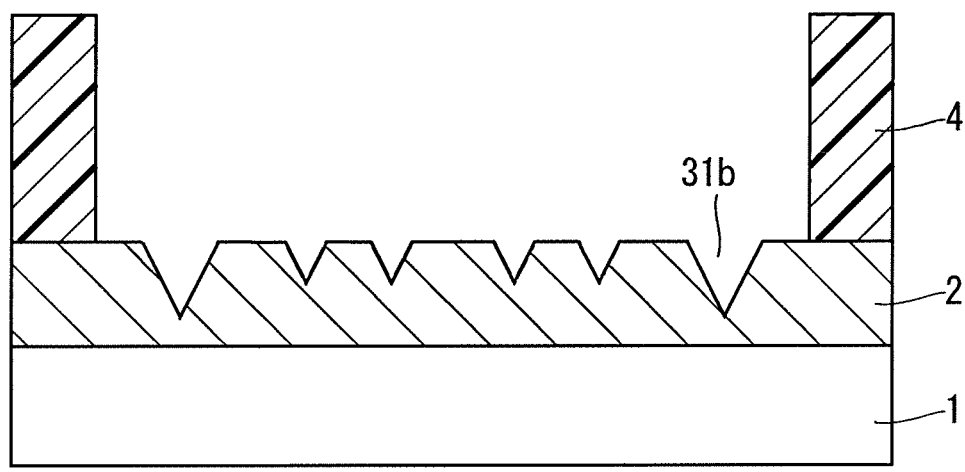

F I G. 8
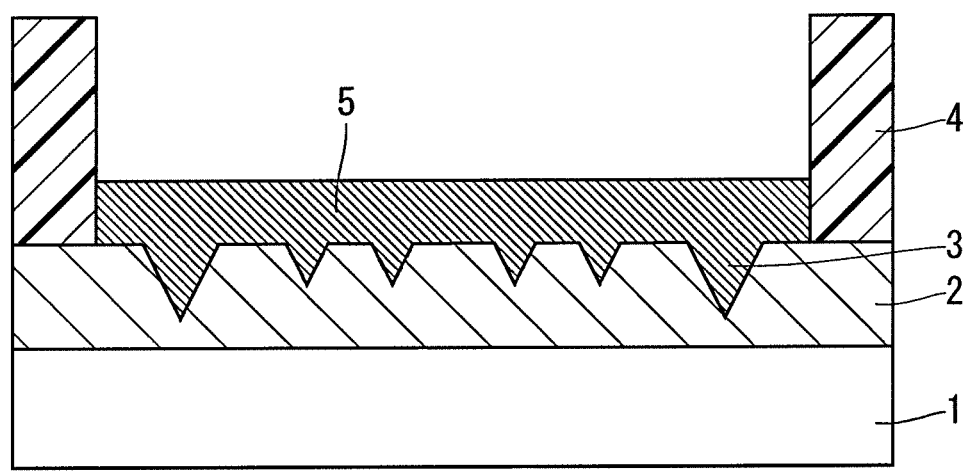

F I G. 9
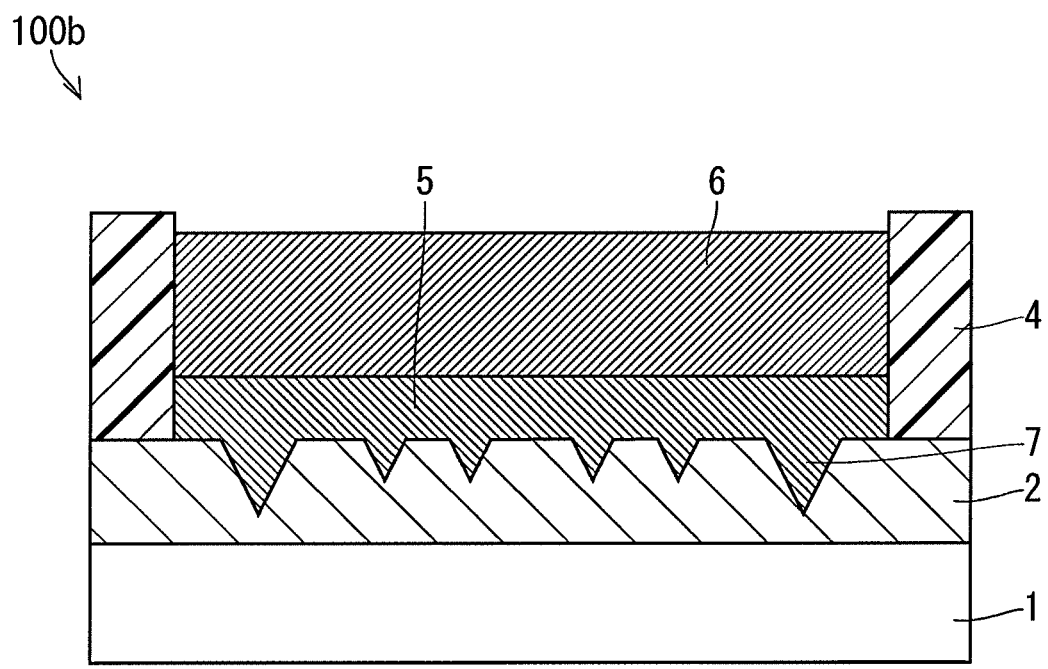

F I G. 1 2
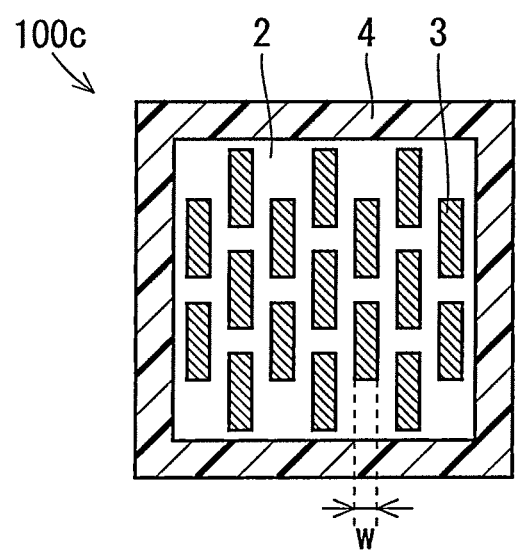

F I G. 1 3
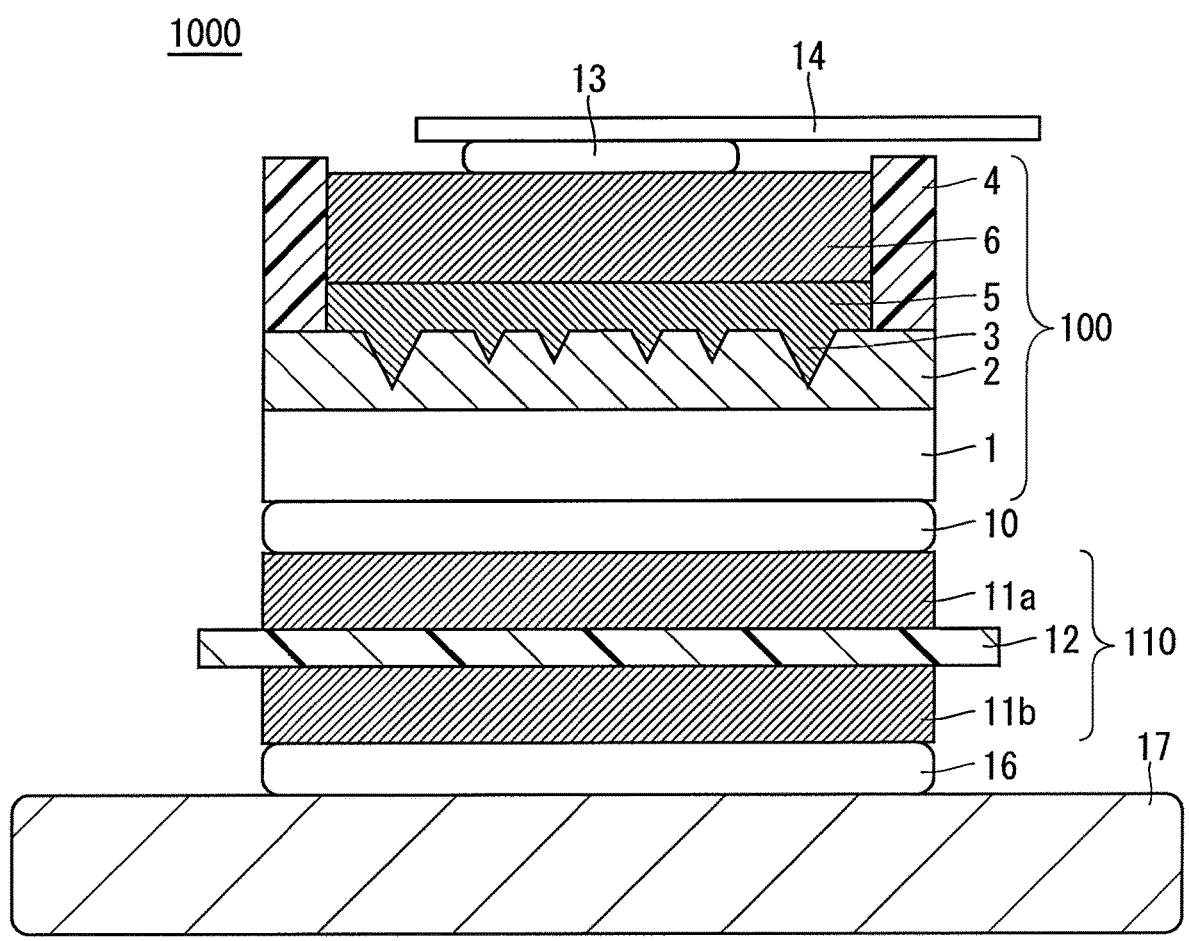

F I G. 1 6
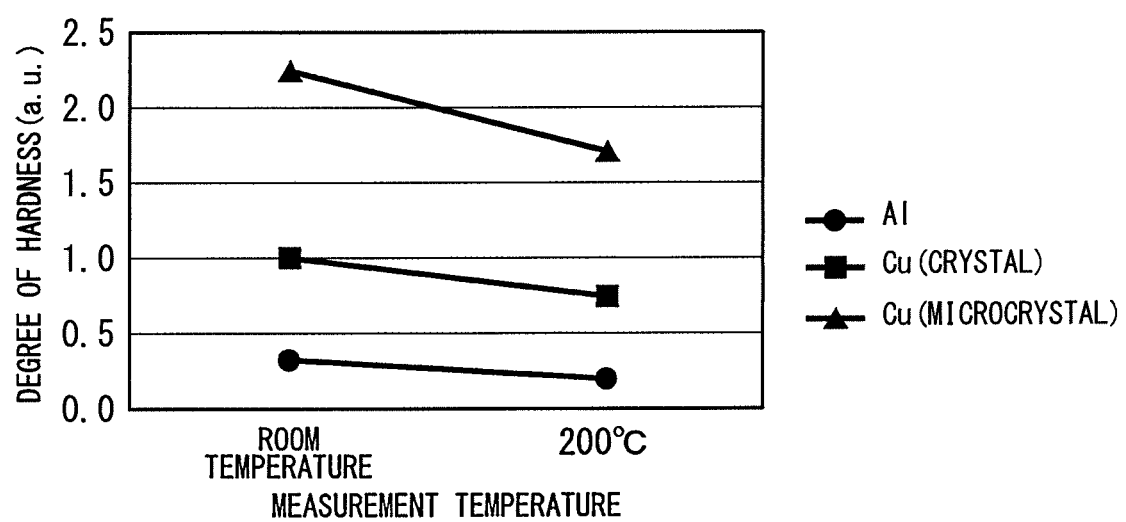

SEMICONDUCTOR DEVICE AND METHOD OF MANUFACTURING SEMICONDUCTOR DEVICE

CROSS-REFERENCE TO RELATED APPLICATION

The present application is based on PCT filing PCT/JP2020/015552, filed Apr. 6, 2020, the entire contents of which are incorporated herein by reference.

TECHNICAL FIELD

The present disclosure relates to a semiconductor device and a method of manufacturing the semiconductor device.

BACKGROUND ART

A switching device such as a silicon insulated gate bipolar transistor (IGBT) and a metal oxide semiconductor field effect transistor (MOSFET) is used as a means of switching an execution and suspension of an electrical power supply for driving load such as an electrical motor in a power electronic apparatus. Examples of a particularly important device in the MOSFET used as a power semiconductor device include a vertical MOSFET. The vertical MOSFET includes a semiconductor layer in which an n-type semiconductor layer, a drift layer, and a p-type semiconductor layer in which a channel are formed, for example, are stacked, a source electrode, a gate electrode, and a drain electrode, for example.

A semiconductor element including silicon (Si) as a base material and an electrode including aluminum (Al) as a main component are used in a conventional semiconductor device operating under a temperature lower than 200° C. However, the semiconductor device is required to operate under a temperature of 200° C. or more in accordance with increase in current capacity flowing in the semiconductor device. A wide bandgap semiconductor attracts attention as a base material of a semiconductor element so that the semiconductor device operates in a temperature of 200° C. or more. The wide bandgap semiconductor is a semiconductor having a larger bandgap than Si and having a large insulation breakdown field, and examples thereof include silicon carbide (SiC), nitride, and diamond.

Patent Document 1 discloses a laminated electrode of Cu/Al in which a copper (Cu) electrode layer as a high-melting material is stacked on an aluminum electrode layer made up of Al as a main component in response to needs of high-temperature operation and high reliability. An object thereof is to reduce a damage on the semiconductor element from a Cu wire at a time of manufacturing a module using the Cu wire.

PRIOR ART DOCUMENTS

Patent Documents

Patent Document 1: Japanese Patent Application Laid-Open No. 2018-037684

SUMMARY

Problem to be Solved by the Invention

When a power semiconductor device operates under a temperature of 200° C. or more using a laminated structure of an aluminum electrode layer and a copper electrode layer as with a case of Patent Document 1, stress occurs in accordance with a difference of a linear expansion coefficient between the aluminum electrode layer, the copper electrode layer on the aluminum electrode layer, and a module member. The aluminum electrode layer has a largest linear expansion coefficient, thus stress is concentrated on the aluminum electrode layer.

In the laminated structure of the aluminum electrode layer and the copper electrode layer, an interface between the aluminum electrode layer and the copper electrode layer and the aluminum electrode layer, which has a lower degree of hardness than the copper electrode layer and has a recrystallizing temperature lower than 200° C. and thus has a further lower degree of hardness under a temperature of 200° C. or more, becomes a weak point.

Thus, a problem referred to as an Al slide in which the aluminum electrode layer and the copper electrode layer are detached or the aluminum electrode layer is deformed occurs when stress occurs under a temperature of 200° C. or more.

The present disclosure therefore has been made to solve the above problems, and it is an object to provide a semiconductor device capable of suppressing an Al slide at a time of operating under a high temperature in a laminated structure of an aluminum electrode layer and a copper electrode layer.

Means to Solve the Problem

According to one aspect of the present disclosure, provided is a semiconductor device including: a semiconductor element; an aluminum electrode layer provided on an upper surface of the semiconductor element and including aluminum as a main component; a first copper electrode layer provided on an upper surface of the aluminum electrode layer and including copper as a main component; and a second copper electrode layer provided on an upper surface of the first copper electrode layer, having crystal grains larger than crystal grains in the first copper electrode layer, and including copper as a main component, wherein the first copper electrode layer includes a plurality of protruding regions as regions protruding toward the aluminum electrode layer in an interface with the aluminum electrode layer.

According to another aspect of the present disclosure, provided is a method of manufacturing a semiconductor device including: an aluminum electrode layer formation process of forming, on an upper surface of a semiconductor element, an aluminum electrode layer including aluminum as a main component and provided with a plurality of first depression portions in an upper surface of the aluminum electrode layer; a first copper electrode layer formation process of forming a first copper electrode layer including copper as a main component, and including a plurality of protruding regions corresponding to the plurality of first depression portions in a region including the plurality of first depression portions in a plan view on an upper surface of the aluminum electrode layer; and a second copper electrode layer formation process of forming a second copper electrode layer having crystal grains larger in size than crystal grains of the first copper electrode layer on an upper surface of the first copper electrode layer.

Effects of the Invention

In the semiconductor device according to the present disclosure, the first copper electrode layer includes the plurality of protruding regions as the regions protruding toward the aluminum electrode layer in the interface with the aluminum electrode layer. Accordingly, an Al slide can be suppressed at a time of an operation under a high temperature in a laminated structure of the aluminum electrode layer and the copper electrode layer.

These and other objects, features, aspects and advantages relating to the technique disclosed in the specification of the present application will become more apparent from the following detailed description of the present invention when taken in conjunction with the accompanying drawings.

BRIEF DESCRIPTION OF DRAWINGS

FIG. 1 A cross-sectional view illustrating a semiconductor device according to an embodiment 1.

FIG. 3 A cross-sectional view illustrating a process of manufacturing the semiconductor device according to the embodiment 1.

FIG. 6 A cross-sectional view illustrating a process of manufacturing the semiconductor device according to the embodiment 1.

FIG. 7 A cross-sectional view illustrating a process of manufacturing the semiconductor device according to the embodiment 1.

FIG. 8 A cross-sectional view illustrating a process of manufacturing the semiconductor device according to the embodiment 1.

FIG. 9 A cross-sectional view illustrating a semiconductor device according to an embodiment 2.

FIG. 12 A cross-sectional view illustrating a configuration of the semiconductor device according to the embodiment 3 in the in-plane direction.

FIG. 13 A cross-sectional view illustrating a semiconductor device according to an embodiment 4.

FIG. 16 A diagram illustrating characteristics of a material used in the semiconductor device according to the embodiments 1 to 6.

DESCRIPTION OF EMBODIMENT(S)

A. Embodiment 1

<A-1. Configuration>

Figure 2:
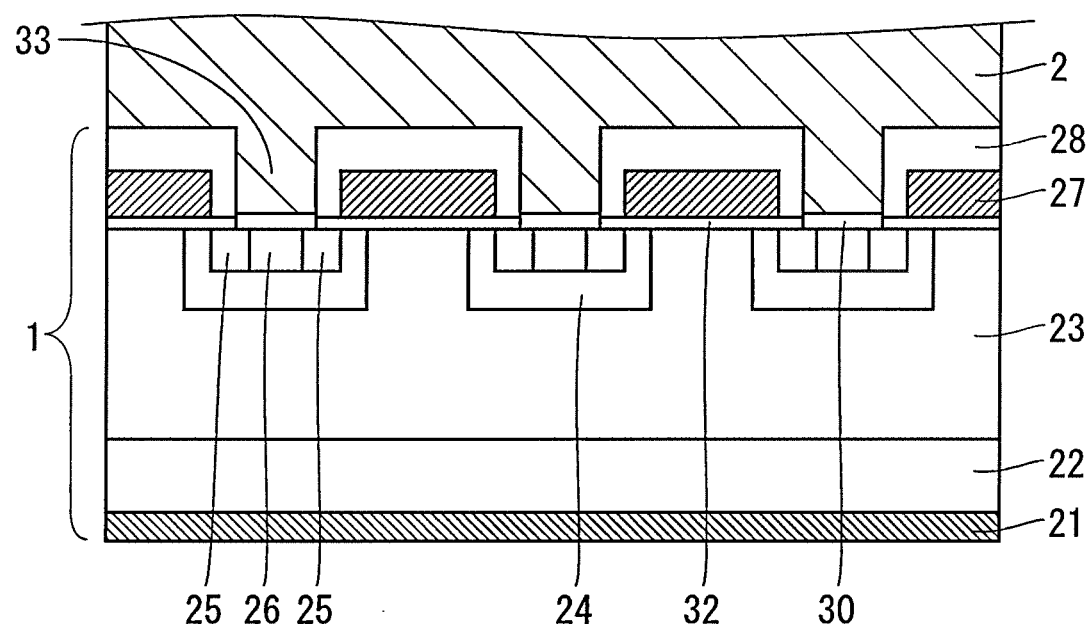
FIG. 2 A cross-sectional view illustrating the semiconductor device according to the embodiment 1.

FIG. 1 is a cross-sectional view illustrating a configuration of a semiconductor chip 100 as a semiconductor device according to an embodiment 1.

Described in the embodiment 1 is an example that a semiconductor element 1 including SiC, which is a wide bandgap semiconductor, as a base material is used in the semiconductor chip 100. The wide bandgap semiconductor is a semiconductor having a larger bandgap than Si and having a large insulation breakdown field strength. The semiconductor element 1 may include a wide bandgap semiconductor other than SiC such as nitride or diamond, for example, instead of SiC.

As illustrated in FIG. 1, the semiconductor chip 100 includes the semiconductor element 1, an aluminum electrode layer 2, a resin film 4, a copper electrode layer 5 as a first copper electrode layer, and a copper electrode layer 6 as a second copper electrode layer.

A semiconductor of the semiconductor element 1 includes a silicon carbide semiconductor as a base material. A thickness of the semiconductor element 1 is within a range from 51 μm to 560 μm. The semiconductor element 1 is described hereinafter.

The aluminum electrode layer 2 includes aluminum as a main component, and is provided on an upper surface of the semiconductor element 1 to be electrically connected to the semiconductor element 1. A main component of a certain element indicates a component of 50 percent by mass or more of all components constituting the element. The aluminum electrode layer 2 may be alloy including aluminum. For example, AlSi or AlCu is used for a material of the aluminum electrode layer 2. A thickness of the aluminum electrode layer 2 is within a range from 0.5 μm to 5 μm. The thickness of the aluminum electrode layer 2 is a distance from an upper surface of an interlayer insulating film 28 to an upper surface of the aluminum electrode layer 2 in a thickness direction described hereinafter.

The resin film 4 is selectively provided on the upper surface of the aluminum electrode layer 2 and includes an opening in a plan view. The resin film 4 includes organic resin such as polyimide, epoxy, or acrylic, for example, as a base material. A thickness of the resin film 4 is within a range from 3 μm to 100 μm.

The copper electrode layer 5 is provided in an opening portion of the resin film 4 on the upper surface of the aluminum electrode layer 2. A degree of hardness of the copper electrode layer 5 is higher than that of the aluminum electrode layer 2. The copper electrode layer 5 includes copper as a main component. A single-component copper or copper alloy including nickel (Ni) may be used for the copper electrode layer 5.

Figure 10:
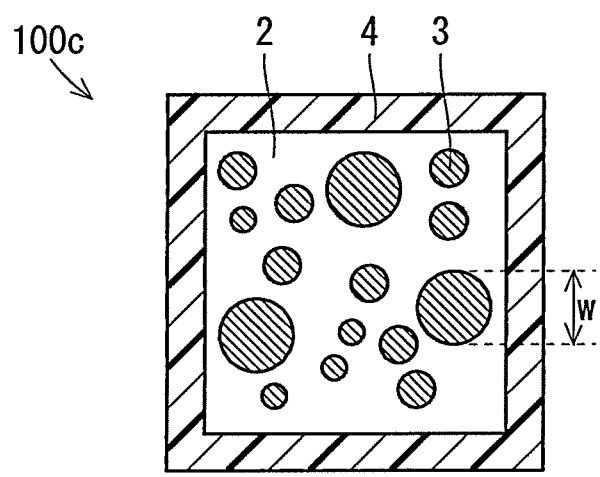
FIG. 10 A cross-sectional view illustrating a configuration of a semiconductor device according to an embodiment 3 in an in-plane direction.
Figure 11:
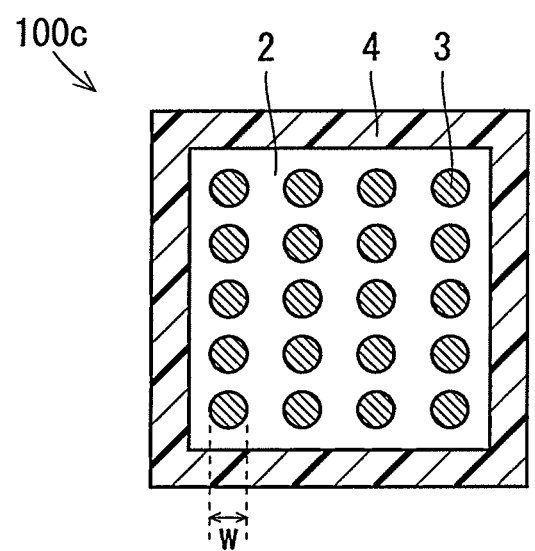
FIG. 11 A cross-sectional view illustrating a configuration of the semiconductor device according to the embodiment 3 in the in-plane direction.

The copper electrode layer 5 includes a plurality of protruding regions 3 as regions protruding toward the aluminum electrode layer 2 in an interface with the aluminum electrode layer 2. A size of crystal grains of the copper electrode layer 5 is smaller in size than a width of a base portion of the protruding region 3 in a plan view. A depth of each protruding region 3 is equal to or larger than 0.2 μm and equal to or smaller than 5.0 μm. A width of a base portion of the protruding region 3 in a plan view is equal to or larger than 0.2 μm and equal to or smaller than 1.0 μm. A width w of the base portion of the protruding region 3 in a plan view is illustrated in FIG. 10, FIG. 11, and FIG. 12 for each arrangement of the protruding regions 3 described in an embodiment 3. However, when a shape of each protruding region 3 is different from each other, the width w depends on the shape of the protruding region 3. The width of the protruding region 3 gets smaller in a depth direction as illustrated in FIG. 1. The copper electrode layer 5 includes the plurality of protruding regions 3 as the regions protruding toward the aluminum electrode layer 2, thus a deformation of the aluminum electrode layer 2 caused by stress occurring in the aluminum electrode layer 2 can be suppressed. The suppression of the deformation of the aluminum electrode layer 2 performed by the protruding regions 3 is described in more detail in <A-2. Reason why Al slide can be suppressed>.

A size of the crystal grains is defined by an average value as described hereinafter. An average grain diameter is calculated by measuring the number of crystal grains included in a certain straight line and dividing a length of a straight portion by the number of the crystal grains.

A thickness of the copper electrode layer 5 is within a range from 5 μm to 30 μm.

The copper electrode layer 6 includes copper as a main component, and is provided on an upper surface of the copper electrode layer 5. The copper electrode layer 6 includes copper as a main component. A single-component copper or copper alloy including nickel (Ni) may be used for the copper electrode layer 6. The size of crystal grains of the copper electrode layer 6 is larger than that of the copper electrode layer 5. A thickness of the copper electrode layer 6 is within a range from 5 μm to 100 μm.

In the semiconductor chip 100 in FIG. 1, the semiconductor element 1 includes a wide bandgap semiconductor as a base material, and a current density flowing in the semiconductor chip 100 is higher than a current density in a case of using a semiconductor element including Si as a base material. Accordingly, a current capacity flowing in the copper electrode layer 5 and the copper electrode layer 6 is also large. From a viewpoint of a maximum allowable current density of the copper electrode layer 5 and the copper electrode layer 6 and a heat radiation property of the copper electrode layer 5 and the copper electrode layer 6, each of the copper electrode layer 5 and the copper electrode layer 6 preferably has a thickness of 5 μm or more.

An upper surface of the copper electrode layer 6 is not covered by the resin film 4 but is exposed in the semiconductor chip 100. A lead electrode for applying voltage to the semiconductor chip 100, for example, is connected to the exposed surface.

FIG. 2 illustrates a configuration of the semiconductor element 1. Omitted in FIG. 2 is a structure above a midway of the aluminum electrode layer 2.

The semiconductor element 1 includes a drain electrode 21, a silicon carbide substrate 22, a drift layer 23, a well region 24, a source region 25, a contact region 26, a gate electrode 27, an interlayer insulating film 28, a silicide film 30, and a gate oxide film 32. In the description hereinafter, an n-type conductivity type and a p-type conductivity type may be switched. When the n-type conductivity type and the p-type conductivity type are switched, impurity used for ion implantation is also changed in accordance with switching of the conductivity type.

The silicon carbide substrate 22 is an n-type silicon carbide semiconductor.

The drift layer 23 is formed on an upper surface of the silicon carbide substrate 22, and includes n-type impurity at a lower concentration than the silicon carbide substrate 22.

The plurality of well regions 24 including p-type impurity are selectively formed on an upper layer portion of the drift layer 23.

The contact region 26 including p-type impurity at a higher concentration than the well region 24 is selectively formed on an upper layer portion of each well region 24.

The source region 25 including n-type impurity is formed to surround the contact region 26 in a plan view on the upper layer portion of each well region 24.

The source region 25 and the contact region 26 do not have contact with the drift layer 23.

The gate oxide film 32 is selectively formed on an upper surface of the drift layer 23.

The gate electrode 27 is formed on the gate oxide film 32.

The interlayer insulating film 28 is formed so that the gate electrode 27 is surrounded by the gate oxide film 32 and the interlayer insulating film 28. A wiring connected to the gate electrode 27 is appropriately provided.

The gate electrode 27 is formed to face a region connecting the source region 25 and the drift layer 23 on an upper surface of the well region 24.

The silicide film 30 is formed on upper surfaces of the source region 25 and the contact region 26.

The aluminum electrode layer 2 is provided on an upper surface of the semiconductor element 1, and has contact with a silicide film 30 via a source contact hole 33 to be electrically connected to the semiconductor element 1. That is to say, an interface between the aluminum electrode layer 2 and the semiconductor element 1 is uneven as illustrated in FIG. 2, however, the unevenness is omitted, and the interface therebetween is illustrated by a straight line in FIG. 1, for example. In the present disclosure, the semiconductor element 1 is used to indicate an element which does not include the aluminum electrode layer 2, the copper electrode layer 5, and the copper electrode layer 6, and the semiconductor chip 100 is used to indicate an element including the aluminum electrode layer 2, the copper electrode layer 5, and the copper electrode layer 6.

A wide bandgap semiconductor is used for the semiconductor element 1, thus high withstand voltage characteristics can be achieved compared with a case where silicon is used as a semiconductor. A wide bandgap semiconductor is used for the semiconductor element 1, thus the semiconductor element 1 can operate under a high temperature of 200° C. or more, for example.

An electrode layer of a semiconductor chip using a wide bandgap semiconductor needs to be formed thicker in accordance with increase in a current capacity flowing in the semiconductor chip. Thus, a copper electrode layer is formed thick using a plating method, for example, to manufacture a semiconductor device. At that time, a copper seed layer is formed, and a copper electrode layer can also be formed by an electrolytic plating method, however, when such a method is used, a process needs to be drastically changed from an existing aluminum electrode layer formation process. Thus, an aluminum electrode layer is formed firstly, and a Cu electrode layer is formed thereon, thus change in process from the existing aluminum electrode layer formation process can be suppressed.

<A-2. Reason why Al Slide can be Suppressed>

The formation of the copper electrode layer 5 including a plurality or protruding regions 3 as the regions protruding toward the aluminum electrode layer 2 in the interface with the aluminum electrode layer 2 targets the following effect.

When a module is assembled using the semiconductor chip 100 illustrated in FIG. 1 and is operated at a high temperature of 200° C. or more, stress occurs in the aluminum electrode layer 2 by a difference of a linear expansion coefficient between a module member and the semiconductor chip 100, particularly between a module member and the aluminum electrode layer 2.

The aluminum electrode layer 2 is formed of a low-melting material, thus is easily softened in a high-temperature operation at a temperature of 200° C. or more. FIG. 16 illustrates a change in a hardness value (Vickers hardness) of a metal film in accordance with a temperature change. The hardness value illustrated in FIG. 16 is a relative comparison value obtained by nano indenter and normalized by a value of Cu (crystal) measure at room temperature. FIG. 16 is a hardness value of three types of metal films of Al, Cu (crystal), and Cu (microcrystal) at room temperature and a temperature of 200° C. Al is an aluminum film made up of a single-component aluminum, Cu (crystal) is a copper film made up of a single-component copper including crystal grains having a size of 1 μm, and Cu (microcrystal) is a copper film made up of a single-component copper including crystal grains having a size of 0.2 μm.

When a temperature of Al is increased to 200° C., a degree of hardness thereof decreases to approximately 64% of that at room temperature. Similarly, when a temperature of Cu (crystal) is increased to 200° C., a degree of hardness thereof decreases to approximately 76% of that at room temperature. However, a hardness value of Cu (crystal) is approximately three times higher than that of Al at room temperature, thus it is recognized that the degree of hardness of Cu (crystal) is kept high even at a high temperature. Furthermore, it is recognized that in a case of Cu (microcrystal) having smaller crystal grains than Cu (crystal), a degree of hardness increases by Hall-Petch equation compared with the case of Cu (crystal). According to Hall-Petch system, it is recognized that when a size of the crystal grain is changed from 1 μm to 0.2 μm, for example, a strength thereof becomes $\sqrt{5}$ times. In this manner, a layer having a high degree of hardness at the time of high-temperature operation at a temperature of 200° C. or more can be formed by using copper in place of aluminum and further controlling the size of the crystal grain.

Conventionally, when a device provided with an aluminum electrode is operated at a temperature of 200° C. or more, the aluminum electrode is deformed by stress occurring in the softened aluminum electrode. Such a deformation of the aluminum electrode is particularly referred to as an Al slide. Deformation often occurs over the whole aluminum electrode in the Al slide. The Al slide is a problem specific to a component having a large electrode film thickness and electrode area designed for flowing large current such as a power device.

In order to cope with such a problem, the copper electrode layer 5 including copper as a high-melting material and small crystal grains is formed to include the protruding region 3 formed to protrude toward the aluminum electrode layer 2, thus the protruding region 3 having significantly a higher degree of hardness than the aluminum electrode layer 2 at the time of the operation at a temperature of 200° C. or more is formed to protrude toward the aluminum electrode layer 2. The Al slide can be suppressed at the time of the operation under a high temperature in a laminated structure of the aluminum electrode layer 2 and the copper electrode layer 5 under a support of the protruding region 3, and reliability of the semiconductor chip 100 is increased. The shape of the protruding region 3 is set to have a small cross-sectional area in a depth direction, thus a resistance property on stress occurring in the aluminum electrode layer 2 gets large not only in a lateral direction but also in a vertical direction.

The semiconductor chip 100 includes the copper electrode layer 6 having the large size of crystal grains and the low degree of hardness on the copper electrode layer 5 having the small size of crystal grains and the high degree of hardness, thus when the module member and the copper electrode layer 6 are joined, stress between the module member and the copper electrode layer 5 having the high degree of hardness can be reduced.

<A-3. Manufacturing Method>

A method of manufacturing the semiconductor chip 100 is described with an example of a case where the semiconductor chip 100 is a silicon carbide MOSFET.

An n-type drift layer 23 is epitaxially grown using a chemical vapor deposition (CVD) method on one main surface (a main surface on a side of an upper surface) of the silicon carbide substrate 22. The drift layer 23 is a silicon carbide semiconductor layer.

In the description hereinafter, a side on which the drift layer 23 is formed when viewed from the silicon carbide substrate 22 is an upper side and an opposite side thereof is a lower side in the semiconductor chip 100. However, this configuration is not relevant to upper and lower side when the semiconductor chip 100 is actually used.

A thickness of the silicon carbide substrate 22 is 50 to 500 μm, and includes n-type impurity within a range of $1 \times 10^{19}$ to $1 \times 10^{21}$ cm$^{-3}$. A thickness of the drift layer 23 is 1 to 60 μm, and includes n-type impurity within a range of $1 \times 10^{15}$ to $1 \times 10^{17}$ cm$^{-3}$. The thickness of the drift layer 23 is determined by withstand voltage (working voltage) necessary for the silicon carbide MOSFET.

A resist mask having an opening portion from which a region which will serve as the well region 24 is exposed is formed on an upper surface of the drift layer 23 using photolithography technique. This resist mask is used as a mask for preventing impurity implantation.

After the formation of the resist mask, p-type impurity is ion-implanted from an upper side of the resist mask to selectively form the well region 24 on an upper layer portion of the drift layer 23. Herein, a thickness of the well region 24 is 0.5 to 2.0 μm, Al, for example, is used as the p-type impurity, and an impurity concentration thereof is set within a range of $1 \times 10^{17}$ to $5 \times 10^{17}$ cm$^{-3}$. The thickness of the well region 24 is a distance from a lower surface of the gate oxide film 32 to a lower surface of the well region 24 in a thickness direction.

Next, after the resist mask used at the time of formation of the well region 24 is removed, a new resist mask having an opening portion from which a region to be the source region 25 is exposed is formed using photolithography technique. This resist mask is also used as a mask for preventing impurity implantation.

After the formation of the resist mask, n-type impurity is ion-implanted from an upper side of the resist mask to form the source region 25 on an upper layer portion of the well layer 24. Herein, a thickness of the source region 25 is 0.2 to 0.5 μm, nitrogen (N), for example, is used as the n-type impurity, and an impurity concentration thereof is set within a range of $1 \times 10^{18}$ to $1 \times 10^{21}$ cm$^{-3}$.

Next, after the resist mask used at the time of formation of the source region 25 is removed, a new resist mask having an opening portion from which a region to be the contact region 26 is exposed is formed using photolithography technique. This resist mask is also used as a mask for preventing impurity implantation.

After the formation of the resist mask, p-type impurity is ion-implanted from an upper side of the resist mask to form the contact region 26 in a central portion of the source region 25 in a plan view. A thickness of the contact region 26 is 0.2 to 0.5 μm. The p-type impurity implanted at the time of the formation of the contact region 26 is Al, for example. An impurity concentration of the contact region 26 is set within a range of $1 \times 10^{18}$ to $1 \times 10^{21}$ cm$^{-3}$.

Next, after the resist mask used at the time of formation of the contact region 26 is removed, a high-temperature anneal treatment is performed under a temperature of 1500°

C. or more to activate the implanted n-type and p-type impurity. According to the above treatment, the semiconductor chip 100 enters a state illustrated in FIG. 3.

Subsequently, the silicon carbide substrate 22 (including an upper portion structure such as the drift layer 23 formed in the previous process) is exposed to atmosphere including oxygen and moisture vapor under a temperature of approximately 1000° C., thus upper surfaces of the drift layer 23, the well region 24, the source region 25, and the contact region 26 are thermally oxidized to form the gate oxide film 32 of a thermally oxidized film ($SiO_2$).

In the above description, the gate oxide film 32 is a thermally oxidized film, however, the gate oxide film 32 may be an oxide film formed by CVD method, or may also be a laminated film made up of a thermally oxidized film and an oxide film formed by CVD method. Furthermore, a surface of the gate oxide film 32 may be nitrided. Nitriding can be performed by annealing the gate oxide film 32 in nitrogen monoxide (NO) gas or nitrogen dioxide ($N_2O$) gas at a high temperature of 1000° C. or more after the formation of the gate oxide film 32.

Next, a polycrystal silicon film including phosphorus (P) within a range of $1 \times 10^{19}$ to $1 \times 10^{21}$ $cm^{-3}$ is formed on the gate oxide film 32 by CVD method to form the gate electrode 27. A thickness of the gate electrode 27 is set within a range of 300 to 600 nm. The gate electrode 27 may be formed by a p-type polycrystal silicon including boron (B).

Formed next using a photolithography technique is an etching mask including an opening portion so that the gate electrode 27 above the source region 25 and above the contact region 26 is exposed. Subsequently, the gate electrode 27 exposed in the opening portion is removed by etching using the etching mask.

Next, a silicon oxide film having a thickness of 0.5 to 5.0 μm is formed on a whole upper surface of the silicon carbide substrate 22 (including an upper portion structure such as the drift layer 23 formed in the previous process) in a plan view by CVD method, for example, to form the interlayer insulating film 28. Formed next using a photolithography technique is an etching mask including an opening portion so that the interlayer insulating film 28 above the contact region 26 and above the source region 25 around the contact region 26 is exposed. Subsequently, the interlayer insulating film 28 exposed in the opening portion is removed by etching using the etching mask, and the gate oxide film 32 below the interlayer insulating film 28 is also removed to form a source contact hole 33.

Part of the source region 25 and the contact region 26 are exposed in a bottom surface of the source contact hole 33 by the etching.

Next, after the etching mask is removed, an Ni film having a thickness of approximately 50 to 300 nm is formed on a whole upper surface of the silicon carbide substrate 22 (including an upper portion structure such as the drift layer 23 formed in the previous process) in a plan view by sputtering method, for example, and an anneal treatment is performed thereon for silicidation. Accordingly, a metal silicide film (an $NiSi_2$ film herein) is formed as a silicide film 30 on an upper portion of the source region 25 and the contact region 26 exposed to the bottom surface of the source contact hole 33. The Ni film which does not have contact with the silicon carbide semiconductor layer of the drift layer 23, the well region 24, the source region 25, and the contact region 26 does not react, thus remains as Ni.

Figure 4:
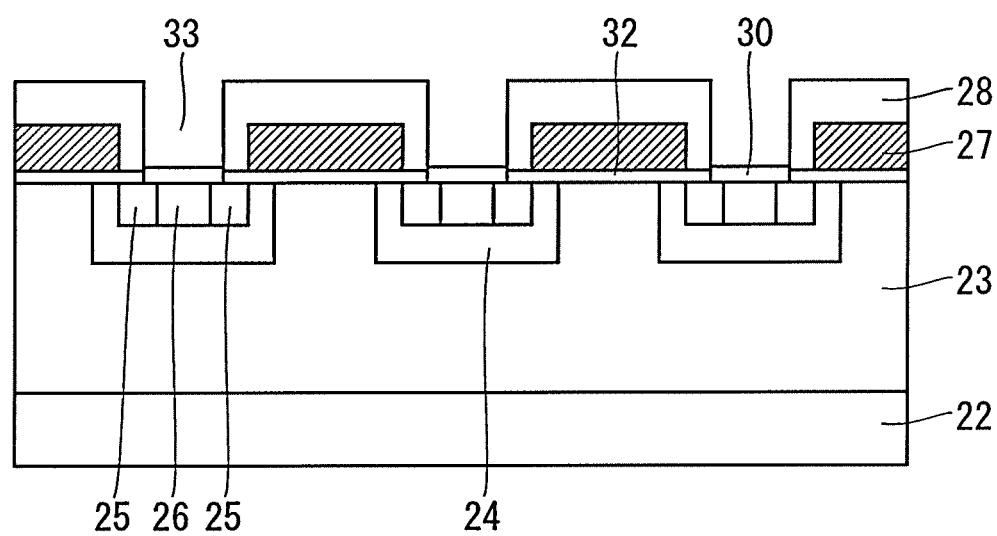
FIG. 4 A cross-sectional view illustrating a process of manufacturing the semiconductor device according to the embodiment 1.

After the silicide film 30 is formed, the silicon carbide substrate 22 (including an upper portion structure such as the drift layer 23 formed in the previous process) is washed by an acid solution including sulfuric acid or hydrochloric acid, for example. The Ni film which has not reacted in the silicide reaction is removed by the washing. The Ni film which has not reacted is removed to obtain the configuration illustrated in FIG. 4.

Subsequently, an Ni film having a thickness of 100 to 500 nm is formed by sputtering method on a lower surface of the silicon carbide substrate 22. Next, a heat treatment is performed on this Ni film for silicidation. This silicided Ni film is one layer in a laminated structure of the drain electrode 21 formed on the lower surface of the silicon carbide substrate 22.

Performed next is an aluminum electrode layer preparation process of forming, on the upper surface of the semiconductor element 1, the aluminum electrode layer 2 including aluminum as a main component and provided with a plurality of depression portions 31 as a plurality of second depression portions in upper surface thereof. In the aluminum electrode layer preparation process, the aluminum electrode layer 2 is formed on the source contact hole 33 and the interlayer insulating film 28. At this time, the plurality of depression portions 31 on the upper surface of the aluminum electrode layer 2 are formed by reflecting the depression portions in the upper surface of the semiconductor element 1 caused by the source contact hole 33. The aluminum electrode layer 2 has a laminated structure in which a titanium (Ti) film is located on a side having contact with the silicide film 30 and an Al film is stacked thereon. The Ti film has a film thickness of 30 to 100 nm, and is formed by sputtering method, for example. The Al film has a film thickness of 1 to 5 μm, and is formed by sputtering method, for example. As for the description of the Ti film, not only a single-component Ti but also a barrier metal such as TiN, Ta, tungsten (W), WN, or TiW may also be applied to the Ti film.

Subsequently, the aluminum electrode layer 2 is patterned by photolithography and an etching treatment.

Subsequently, a resin film is formed on the upper surface of the silicon carbide substrate 22 (including an upper portion structure such as the drift layer 23 formed in the previous process), and the resin film is patterned to have an opening by photolithography and an etching treatment. Accordingly, the resin film 4 covering part of the aluminum electrode layer 2 is formed. A material of the resin film 4 is polyimide as organic resin, for example. A film thickness of the resin film 4 is within a range from 3 μm to 100 μm.

Figure 5:
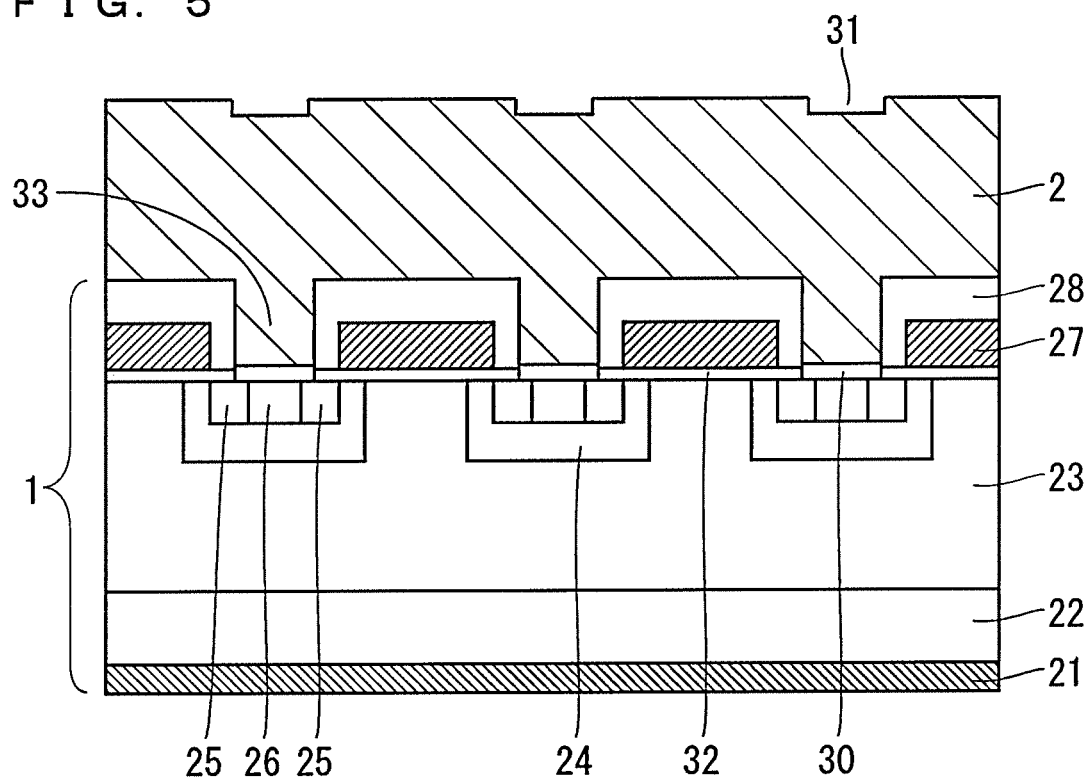
FIG. 5 A cross-sectional view illustrating a process of manufacturing the semiconductor device according to the embodiment 1.

Subsequently, a gold (Au) film having a film thickness of 150 nm or a laminated film made up of an Ni film having a film thickness of 500 nm and an Au film having a film thickness of 150 nm, for example, is formed on a silicided Ni film formed on the lower surface of the silicon carbide substrate 22 by sputtering method, for example, to form the drain electrode 21. A configuration illustrated in FIG. 5 is achieved through the above processes, and the structure of the silicon carbide MOSFET illustrated in FIG. 2 is completed.

Performed subsequently is an wet etching process of forming the aluminum electrode layer 2 provided with the plurality of depression portions 31b by wet etching on the plurality of depression portions 31 as starting points in the aluminum electrode layer 2. In this process, an etching process is performed in a wet form on the aluminum electrode layer 2 in the opening of the resin film 4. Before performing the etching process in the wet form on the aluminum electrode layer 2, the plurality of depression portions 31 are formed on the upper surface of the aluminum electrode layer 2 as illustrated in FIG. 6. The plurality of depression portions 31 are formed in a reflection of a shape of the source contact hole 33. When the aluminum electrode layer 2 is etched in the wet form in FIG. 6, the plurality of depression portions 31 have a larger etching amount than a region with no depression portion, and a depression portion 31b deeper than the depression portion 31 is formed as illustrated in FIG. 7. A depth of each depression portion 31b is 0.2 to 5.0 µm. The depression portion 31b has a shape in which a cross-sectional area gets smaller in a depth direction than an interface between the aluminum electrode layer 2 and the copper electrode layer 5.

Next, a first copper electrode layer formation process is performed. In the first copper electrode layer formation process, the copper electrode layer 5 as the first copper electrode layer including copper as a main component and including the plurality of protruding regions 3 corresponding to the plurality of depression portions 31b is formed in the region including the depression portions 31b in a plan view on the upper surface of the aluminum electrode layer 2. Accordingly, a configuration illustrated in FIG. 8 is achieved. PVD method or plating method may be applied as a method of forming the copper electrode layer 5. The PVD method is sputtering method, for example. When plating method is used, electrolytic plating method or non-electrolytic plating method is used. When the copper electrode layer 5 is formed by electrolytic plating method, a seed layer needs to be formed by PVD method, and the copper electrode layer 5 needs to be formed by electrolytic plating method. The size of crystal grains of the copper electrode layer 5 is equal to or smaller than 0.2 µm. The copper electrode layer 5 formed in a portion of the depression portion 31b, that is to say, the protruding region 3 may have mutual diffusion with the aluminum electrode layer 2 to be a Cu alloy film. Such a case is described in an embodiment 2.

Performed next is a second copper electrode layer formation process of forming the copper electrode layer 6 as the second copper electrode layer having crystal grains larger in size than those of the copper electrode layer 5 on the upper surface of the copper electrode layer 5. The size of each crystal grain of the copper electrode layer 6 is larger than 0.2 µm. PVD method or plating method may be applied as a method of forming the copper electrode layer 6. The PVD method is sputtering method, for example. When plating method is used, electrolytic plating method or non-electrolytic plating method is used. When the copper electrode layer 6 is formed by electrolytic plating method, a seed layer needs to be formed by PVD method, and the copper electrode layer 6 needs to be formed by electrolytic plating method. When the copper electrode layer 6 is formed by non-electrolytic plating method, a size of crystal grains of the copper electrode layer 6 is set to be equal to or larger than 0.5 µm.

When the copper electrode layer 6 having larger crystal grains than the copper electrode layer 5 is formed, a film-forming temperature is increased in PVD method and non-electrolytic plating method to obtain large crystal grains. When the copper electrode layer 6 is formed by electrolytic plating method, the size of the crystal grains can be increased by using a condition of a low current density.

When the copper electrode layer 5 having small crystal grains and having high crystallizability is formed, a film-forming temperature is reduced in PVD method and non-electrolytic plating method to obtain small crystal grains. When the copper electrode layer 5 is formed by electrolytic plating method, the size of the crystal grains can be reduced by using a condition of a high current density.

As described above, the method of manufacturing the semiconductor device according to the present embodiment includes the aluminum electrode layer formation process, the first copper electrode layer formation process, and the second copper electrode layer formation process. Herein, the aluminum electrode layer formation process is the process of forming, on the upper surface of the semiconductor element 1, the aluminum electrode layer 2 including aluminum as the main component, and having the upper surface provided with the plurality of depression portions 31b as the plurality of first depression portions by the aluminum electrode layer preparation process and the wet etching process. According to the method of manufacturing the semiconductor device according to the present embodiment, completed is the semiconductor chip 100 capable of suppressing the Al slide at the time of high temperature operation at a temperature of 200° C. or more illustrated in FIG. 1.

An MOSFET is used as the semiconductor element 1 in the embodiment 1, however, also applicable is the other device such as a Schottky barrier diode, a junction barrier Schottky (JBS) diode, a junction field effect transistor (JFET), an IGBT, or a PN diode, for example.

<A-4. Effect>

The copper electrode layer 5 includes the plurality of protruding regions 3 as the regions protruding toward the aluminum electrode layer 2 in the interface with the aluminum electrode layer 2. Accordingly, the semiconductor chip 100 can suppress the Al slide at the time of the operation under a high temperature in the laminated structure of the aluminum electrode layer 2 and the copper electrode layer 5.

A degree of hardness of the copper electrode layer 5 is higher than that of the aluminum electrode layer 2 under a temperature of 200° C. Accordingly, the semiconductor chip 100 can suppress the Al slide at the time of the operation under a high temperature in the laminated structure of the aluminum electrode layer 2 and the copper electrode layer 5.

The size of crystal grains of the copper electrode layer 5 is equal to or smaller than 0.2 µm. Accordingly, the degree of hardness of the copper electrode layer 5 including the protruding region 3 is increased, and the Al slide can be suppressed at the time of the operation under a high temperature in the laminated structure of the aluminum electrode layer 2 and the copper electrode layer 5.

The depth of each of the plurality of protruding regions 3 is equal to or larger than 0.2 µm and equal to or smaller than 5.0 µm. Accordingly, the Al slide at the time of the operation under a high temperature can be suppressed.

The width of the base portion of each of the plurality of the protruding regions 3 in a plan view is larger than the size of the crystal grains of the copper electrode layer 5. Accordingly, the Al slide at the time of the operation under a high temperature can be suppressed.

The width of the base portion of each of the plurality of the protruding regions 3 in a plan view is equal to or larger than 0.2 µm and equal to or smaller than 1.0 µm. Accordingly, the Al slide at the time of the operation under a high temperature can be suppressed.

The size of crystal grains of the copper electrode layer 6 is equal to or larger than 0.5 µm, for example. Accordingly, the degree of hardness of the copper electrode layer 6 can be lower than that of the copper electrode layer 5, and stress between the module member and the copper electrode layer 5 having a high degree of hardness can be reduced.

The semiconductor chip 100 includes a wide bandgap semiconductor. Accordingly, high withstand voltage characteristics can be achieved compared with a case where silicon is used as a semiconductor.

In the method of manufacturing the semiconductor device according to the present embodiment, the copper electrode layer 5 as the first copper electrode layer including copper as a main component and including the plurality of protruding regions 3 corresponding to the plurality of depression portions 31b is formed in the region including the plurality of depression portions 31b in a plan view in the first copper electrode layer formation process. Accordingly, the semiconductor chip 100 capable of suppressing the Al slide at the time of the operation under a high temperature can be manufactured.

B. Embodiment 2

<B-1. Configuration>

A configuration different from that in the embodiment 1 is described in the embodiment 2, and the description of the same or corresponding configuration is omitted.

FIG. 9 is a cross-sectional view illustrating a configuration of a semiconductor chip 100b as a semiconductor device according to the embodiment 2. In the semiconductor chip 100b, the protruding region 3 of the copper electrode layer 5 in the semiconductor chip 100 is changed to a protruding region 7. Similarly to the protruding region 3, the protruding region 7 is also a region in the copper electrode layer 5 protruding toward the aluminum electrode layer 2. The semiconductor chip 100b is similar to the semiconductor chip 100 in the other point.

A component of the aluminum electrode layer 2 is diffused in the protruding region 7, and the protruding region 7 includes the component of the aluminum electrode layer 2.

As described in the embodiment 1, the size of the crystal grains of the copper electrode layer 5 is equal to or smaller than 0.2 μm. The size of crystal grains of a portion of the protruding region 7 in the copper electrode layer 5 is also equal to or smaller than 0.2 μm. The portion of the protruding region 7 includes the component of the aluminum electrode layer 2, thus adhesiveness between the protruding region 7 and the aluminum electrode layer 2 is increased. Adhesiveness between the protruding region 7 and the aluminum electrode layer 2 is increased, thus a resistance property on stress occurring at the time of the high temperature operation at a temperature of 200° C. or more is increased, and the Al slide at the time of the operation under a high temperature can be suppressed in the laminated structure of the aluminum electrode layer 2 and the copper electrode layer 5. Thus, reliability of the semiconductor chip 100b is increased. When adhesiveness between the protruding region 7 and the aluminum electrode layer 2 is insufficient, there is a possibility that the protruding region 7 is detached from the aluminum electrode layer 2 by stress occurring at the time of the high temperature operation.

<B-2. Effect>

At least part of the copper electrode layer 5 of each of the plurality of protruding regions 7 includes aluminum. Accordingly, adhesiveness between the protruding region 7 and the aluminum electrode layer 2 is increased, and the Al slide at the time of the operation under a high temperature can be suppressed.

C. Embodiment 3

<C-1. Configuration>

A configuration different from that in the embodiment 1 and the embodiment 2 is described in the embodiment 3, and the description of the same or corresponding configuration is omitted.

A semiconductor device according to the embodiment 3 is the same as that according to the embodiment 1 or the embodiment 2 within a scope of the description in the embodiment 1 or the embodiment 2.

A semiconductor chip 100c according to the embodiment 3 is the semiconductor chip 100 according to the embodiment 1 or the semiconductor chip 100b according to the embodiment 2 except that an arrangement pattern of the protruding region 3 is designated. The semiconductor chip 100c is the same as the semiconductor chip 100 or the semiconductor chip 100b except that the arrangement pattern of the protruding region 3 is designated. In the description hereinafter, the semiconductor chip 100c is the same as the semiconductor chip 100 except that the arrangement pattern of the protruding region 3 is designated.

Also described in the embodiment 1, the depression portion 31 is formed in the reflection of the shape of the source contact hole 33, and the depression portion 31b is formed by etching in the wet form on the depression portion 31 as the starting point. That is to say, the shape of the source contact hole 33 in a plan view is changed, thus the shapes of the depression portion 31 and the depression portion 31b in a plan view, and furthermore, a shape of the protruding region 3 in a plan view can be controlled.

FIG. 10, FIG. 11, and FIG. 12 are cross-sectional views in an in-plane direction for illustrating a shape of the base portion of the protruding region 3 in a plan view. Actually, the resin film 4 and the aluminum electrode layer 2 need not be located in the same plane, but are illustrated in the same plane to indicate an arrangement thereof in an in-plane direction. Also described in the embodiment 1, a width w of the base portion of the protruding region 3 in a plan view is 0.2 to 1.0 μm in each of FIG. 10, FIG. 11, and FIG. 12.

FIG. 10 is a schematic view illustrating a case where the shape of the protruding region 3 in a plan view is a circular shape. A size and arrangement of the circular shape are randomly set. The shape of the source contact hole 33 in a plan view is set to be a circular shape, and the size and arrangement of the circular shape are randomly set in <A-3. Manufacturing method>, thus the protruding region 3 with the circular shape in a plan view whose size and arrangement are randomly set is formed.

FIG. 11 illustrates a case where the shape of the protruding region 3 in a plan view is the circular shape and size of each circular shape is the same as each other. In FIG. 11, the plurality of protruding regions 3 are arranged periodically in two directions perpendicular to each other in a plan view. In order to form the protruding regions 3 arranged in such a manner, the shape of each source contact hole 33 in a plan view is set to be the circular shape, the size of each circular shape is unified, and the plurality of source contact holes 33 are provided periodically in two directions perpendicular to each other in a plan view. Herein, the arrangement of the two directions perpendicular to each other also includes a case where the two directions intersect at an angle slightly deviating from a right angle, and includes a case where an angle between the two directions is 80 to 90 degrees, for example.

FIG. 12 illustrates a case where the shape of the protruding region 3 in a plan view is a slit shape. A size of the slit shape is the same as each other, and an arrangement thereof is uniformly formed. The shape of each source contact hole 33 in a plan view is the slit shape, and the size of the shape of each slit is unified or the arrangement thereof is uniformly formed, thus the protruding region 3 having the uniform size and the slit shape is formed as illustrated in FIG. 12.

<C-2. Effect>

The plurality of protruding regions 3 are arranged periodically in two directions perpendicular to each other in a plan view, for example. Accordingly, deformation of the aluminum electrode layer 2 in the in-plane direction can be suppressed regardless of a direction.

The base portion of each of the plurality of the protruding regions 3 has a circular shape in a plan view. Accordingly, the Al slide at the time of the operation under a high temperature can be suppressed.

The base portion of each of the plurality of the protruding regions 3 has a slit shape in a plan view. Accordingly, the Al slide at the time of the operation under a high temperature can be suppressed.

D. Embodiment 4

<D-1. Configuration and Effect>

A configuration different from that in the embodiment 1 to the embodiment 3 is described in the embodiment 4, and the description of the same or corresponding configuration is omitted.

In the embodiment 1 to the embodiment 3, the semiconductor device is a so-called semiconductor chip 100 illustrated in FIG. 1. However, in the present disclosure, the semiconductor device not only indicates the semiconductor chip 100 illustrated in FIG. 1 but also includes a so-called power module provided with an insulating substrate and a lead electrode in addition to the semiconductor chip 100. In the description in the embodiment 4, the semiconductor device is a so-called power module.

FIG. 13 illustrates a power module 1000 as a semiconductor device according to the embodiment 4.

As illustrated in FIG. 13, a power module 1000 includes the semiconductor chip 100, a joint material 10 as an insulating substrate joint material, an insulating substrate 110 joined to the semiconductor chip 100 via the joint material 10, a joint material 16, a cooler 17 joined to the insulating substrate 110 via the joint material 16, a joint material 13 as an electrode joint material, and a lead electrode 14 joined to the semiconductor chip 100 via the joint material 13.

The lead electrode 14 is an electrical and thermal good conductor made of copper or aluminum. The lead electrode 14 is joined to an upper surface of the copper electrode layer 6 by the joint material 13.

The insulating substrate 110 includes an insulating plate 12, a conductive plate 11a, and a conductive plate 11b. The conductive plate 11a is provided on one surface of the insulating plate 12, and the conductive plate 11b is provided on the other surface of the insulating plate 12.

Used for a base material of the insulating plate 12 is ceramic as an insulator in an electrical viewpoint and a thermal good conductor such as silicon nitride, aluminum nitride, or alumina, for example. When silicon nitride is applied to the base material of the insulating plate 12, a thickness thereof is 0.10 mm to 1.00 mm, for example. The conductive plate 11a and the conductive plate 11b are electrical and thermal good conductors, and are copper plates, for example.

The cooler 17 is formed of a metal material having a favorable thermal conduction such as copper or aluminum.

Used for the joint materials 10 and 13 is a joint material as an electrical and thermal good conductor such as a low temperature sintered material having silver nanoparticles, a silver paste material, a liquid phase diffusion joint material such as Cu—Sn or Ag—Sn, or a solder, for example.

In FIG. 13, the cooler 17 is placed on a side of the drain electrode 21 of the semiconductor chip 100 (a lower side of the semiconductor chip 100), but may be placed on a side of the copper electrode layer 6 of the semiconductor chip 100 (an upper side of the semiconductor chip 100). The cooler 17 may be placed on both the upper and lower sides of the semiconductor chip 100.

The power module 1000 includes a wide bandgap semiconductor, thereby being able to be operated under a temperature of 200° C. or more. Used is the configuration of suppressing thermal resistance between the semiconductor chip 100 and the cooler 17, thus downsizing of the power module 1000 can be achieved, and general-purpose properties are increased. The power module 1000 having such a configuration is used, thus downsizing of an inverter can also be achieved.

The power module 1000 includes the semiconductor chip 100 as the semiconductor device according to the embodiment 1, thus has an effect similar to the embodiment 1 in a portion of the semiconductor chip 100. In the present embodiment, the power module 1000 as the semiconductor device capable of suppressing the Al slide at the time of the operation under a high temperature is achieved by the configuration that the semiconductor chip 100 is included as the semiconductor chip and the lead electrode 14 is joined to the upper surface of the copper electrode layer 6 by the joint material 13.

The power module 1000 may include the semiconductor chip 100b or the semiconductor chip 100c instead of the semiconductor chip 100. Also in such a case, the power module 1000 as the semiconductor device capable of suppressing the Al slide at the time of the operation under a high temperature is achieved by the configuration that the semiconductor chip 100b or the semiconductor chip 100c is included as the semiconductor chip and the lead electrode 14 is joined to the upper surface of the copper electrode layer 6 by the joint material 13.

<D-2. Manufacturing Method>

Described hereinafter is a method of manufacturing a semiconductor device for manufacturing the power module 1000 as the semiconductor device based on a premise that the semiconductor chip 100 included in the power module 1000 is the semiconductor chip 100 according to the embodiment 1.

Firstly, the semiconductor chip 100 is made in accordance with the manufacturing method described in <A-3. Manufacturing method>.

Next, the insulating substrate 110 is joined to a lower surface of the semiconductor chip 100 via the joint material 10. The lower surface of the semiconductor chip 100 is a surface of the semiconductor chip 100 on an opposite side from a surface on which the copper electrode layer 6 is formed.

In the description of the present disclosure, a side of the semiconductor chip 100 on which the drift layer 23 is formed when viewed from the silicon carbide substrate 22 is an upper side. That is to say, the insulating substrate 110 is provided on a lower side of the semiconductor chip 100. It is sufficient that the insulating substrate 110 is joined to the lower side of the semiconductor chip 100, and the joint material 10, for example, may be located between the insulating substrate 110 and the semiconductor chip 100.

Next, the cooler 17 is joined, via the joint material 16, to a surface of the insulating substrate 110 on a side opposite to a surface on which the semiconductor chip 100 is joined. The surface of the insulating substrate 110 on the side opposite to the surface on which the semiconductor chip 100 is joined is located on a lower side of the insulating substrate 110. It is sufficient that the cooler 17 is joined to the lower side of the insulating substrate 110, thus the joint material 16 or the other member may be located between the cooler 17 and the insulating substrate 110.

Next, the lead electrode 14 is joined to the copper electrode layer 6 of the semiconductor chip 100 via the joint material 13.

E. Embodiment 5

<E-1. Configuration and Effect>

A configuration different from that in the embodiment 4 is described in the embodiment 5, and the description of the same or corresponding configuration is omitted.

Figure 14:
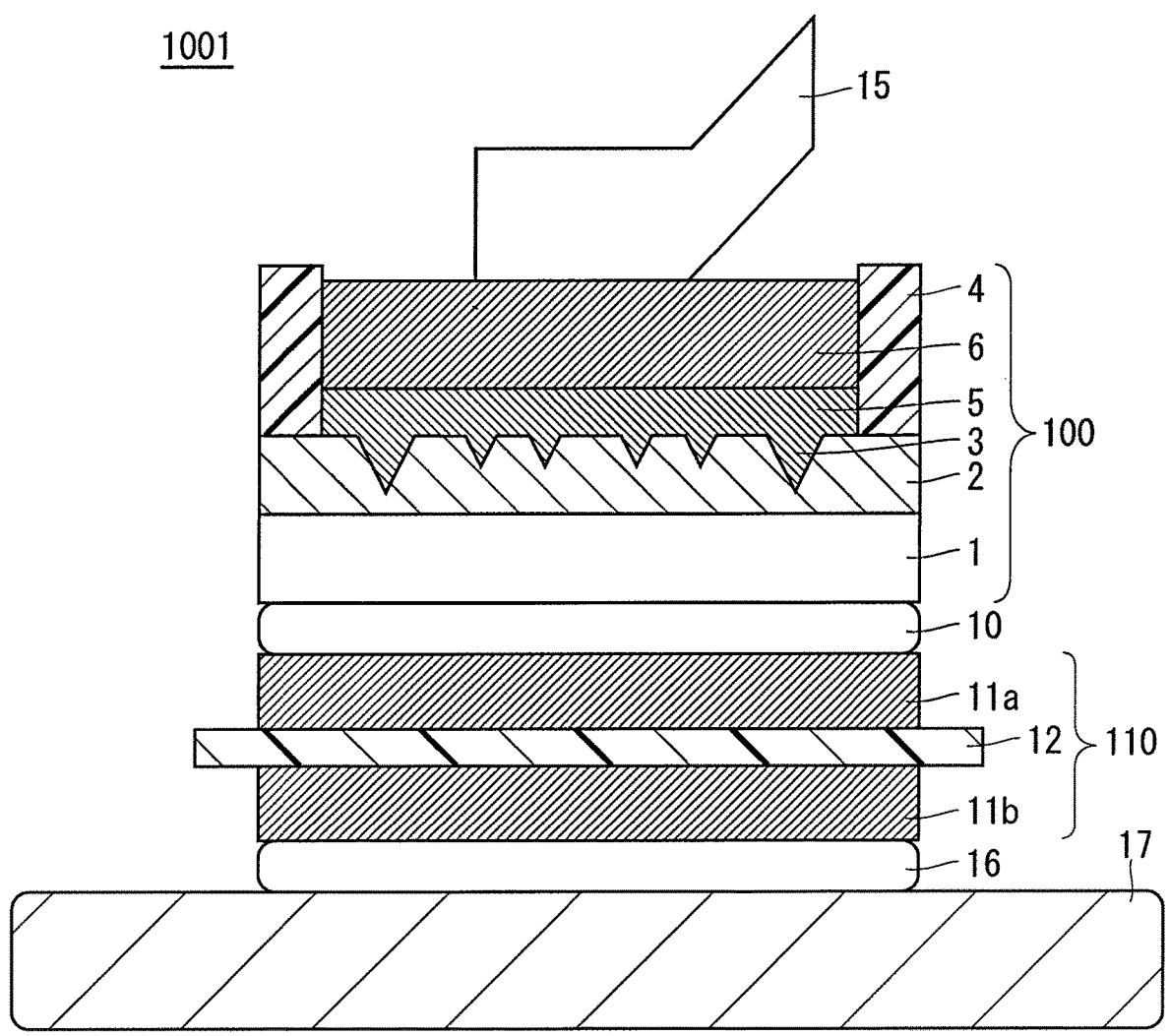
FIG. 14 A cross-sectional view illustrating a semiconductor device according to an embodiment 5.

FIG. 14 illustrates a power module 1001 as a semiconductor device according to the embodiment 5. The power module 1001 in FIG. 14 is different from the power module 1000 according to the embodiment 4 in that the power module 1001 includes a bonding wire 15 joined to the semiconductor chip 100 instead of the lead electrode 14 joined to the semiconductor chip 100 via the joint material 13. A configuration of the power module 1001 is the same as that of the power module 1000 in the other point. In the description, the power module 1001 includes the semiconductor chip 100, however, the power module 1001 may include the semiconductor chip 100b or the semiconductor chip 100c instead of the semiconductor chip 100 in the manner similar to the case in the embodiment 4.

The bonding wire 15 is directly joined to the copper electrode layer 6 of the semiconductor chip 100. A material of the bonding wire 15 is an electrical and thermal good conductor made of Cu, Al, Au, or alloy thereof, for example.

The power module 1001 includes a wide bandgap semiconductor, thereby being able to be operated under a temperature of 200° C. or more. Used is the configuration of suppressing thermal resistance between the semiconductor chip 100 and the cooler 17, thus downsizing of the power module 1001 can be achieved, and general-purpose properties are increased. The power module 1001 having such a configuration is used, thus downsizing of an inverter can also be achieved.

The power module 1001 includes the semiconductor chip 100 as the semiconductor device according to the embodiment 1, thus has an effect similar to the embodiment 1 in a portion of the semiconductor chip 100. In the present embodiment, the power module 1001 as the semiconductor device capable of suppressing the Al slide at the time of the operation under a high temperature is achieved by the configuration that the semiconductor chip 100 is included as the semiconductor chip and the bonding wire 15 is joined to the copper electrode layer 6 of the semiconductor chip 100.

F. Embodiment 6

<F-1. Configuration and Effect>

A configuration different from that in the embodiment 5 is described in the embodiment 6, and the description of the same or corresponding configuration is omitted.

Figure 15:
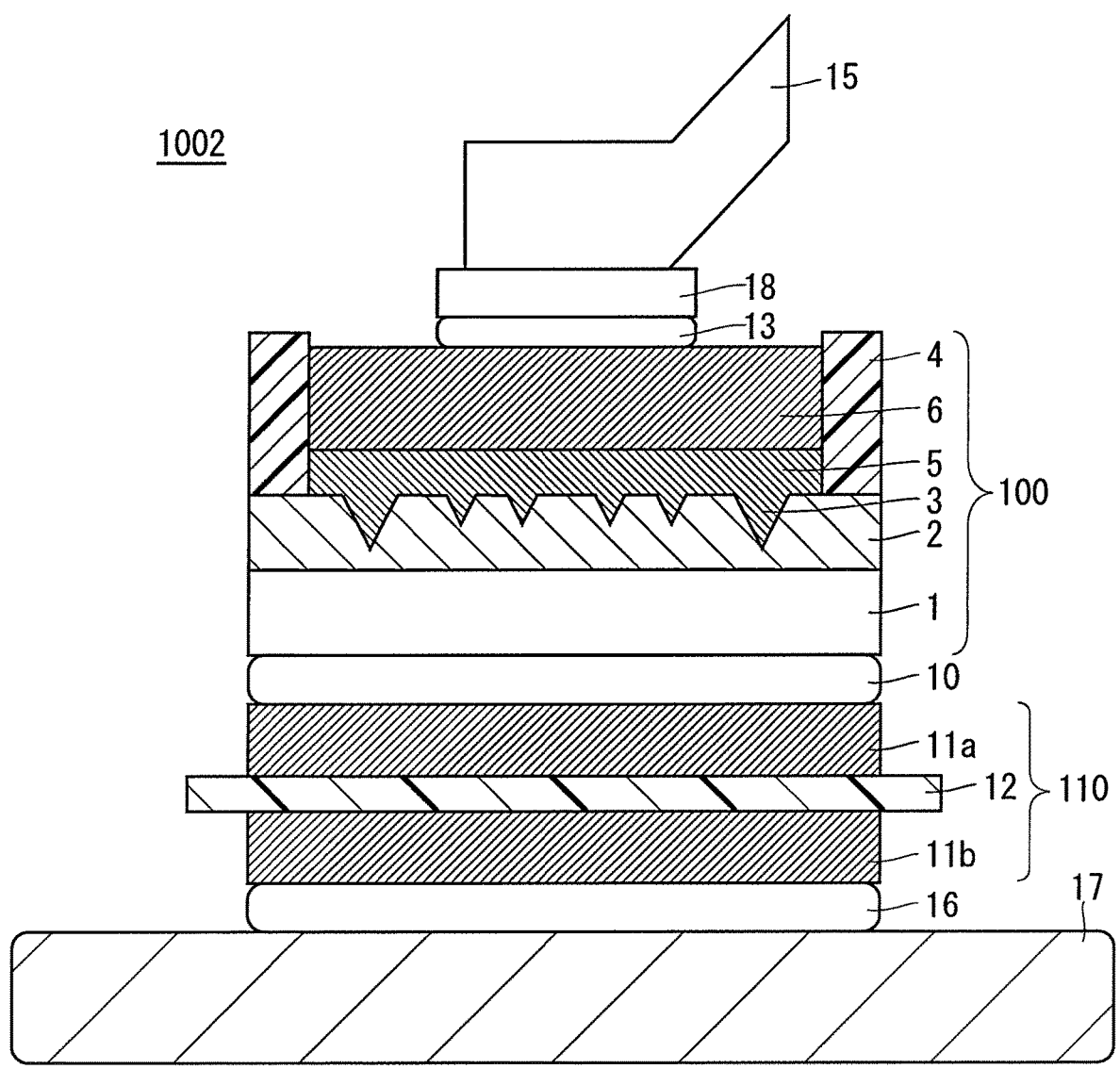
FIG. 15 A cross-sectional view illustrating a semiconductor device according to an embodiment 6.

FIG. 15 illustrates a power module 1002 as a semiconductor device according to the embodiment 6. The power module 1002 is different from the power module 1001 in that the power module 1002 includes the bonding wire 15 joined to a buffer plate 18 joined to the semiconductor chip 100 via the joint material 13 instead of the bonding wire 15 joined to the semiconductor chip 100. In the description, the power module 1002 includes the semiconductor chip 100, however, the power module 1002 may include the semiconductor chip 100b or the semiconductor chip 100c instead of the semiconductor chip 100 in the manner similar to the case in the embodiment 5.

The buffer plate 18 is joined to the upper surface of the copper electrode layer 6 of the semiconductor chip 100 via the joint material 13, and the bonding wire 15 is joined to the buffer plate 18.

A material of the bonding wire 15 included in the power module 1002 is the same as that of the bonding wire 15 included in the power module 1001 according to the embodiment 5.

The power module 1002 includes a wide bandgap semiconductor, thereby being able to be operated under a temperature of 200° C. or more. Used is the configuration of suppressing thermal resistance between the semiconductor chip 100 and the cooler 17, thus downsizing of the power module 1002 can be achieved, and general-purpose properties are increased. The power module 1002 having such a configuration is used, thus downsizing of an inverter can also be achieved.

The power module 1002 includes the semiconductor chip 100 as the semiconductor device according to the embodiment 1, thus has an effect similar to the embodiment 1 in a portion of the semiconductor chip 100. In the present embodiment, the power module 1002 as the semiconductor device capable of suppressing the Al slide at the time of the operation under a high temperature is achieved by the configuration that the semiconductor chip 100 is included as the semiconductor chip, the buffer plate 18 is joined to the upper surface of the copper electrode layer 6 of the semiconductor chip 100 via the bonding material 13, and the bonding wire 15 is joined to the buffer plate 18.

Each embodiment can be arbitrarily combined, or each embodiment can be appropriately varied or omitted.

EXPLANATION OF REFERENCE SIGNS

1 Semiconductor element, 2 aluminum electrode layer, 3, 7 protruding region, 4 resin film, 5, 6 copper electrode layer, 10, 13, 16 joint material, 11a, 11b conductive plate, 12 insulating plate, 14 lead electrode, 15 bonding wire, 17 cooler, 18 buffer plate, 21 drain electrode, 22 silicon carbide substrate, 23 drift layer, 24 well region, 25 source region, 26 contact region, 27 gate electrode, 28 interlayer insulating film, 30 silicide film, 31, 31b depression portion, 32 gate oxide film, 33 source contact hole, 100, 100b, 100c semiconductor chip, 110 insulating substrate, 1000, 1001, 1002 power module.

The invention claimed is:

1. A semiconductor device, comprising:
a semiconductor element including a wide bandgap semiconductor;
an aluminum electrode layer provided on an upper surface of the semiconductor element and including aluminum as a main component;
a first copper electrode layer provided on an upper surface of the aluminum electrode layer and including copper as a main component; and
a second copper electrode layer provided on an upper surface of the first copper electrode layer, having crystal grains larger than crystal grains in the first copper electrode layer, and including copper as a main component, wherein the first copper electrode layer includes a plurality of protruding regions as regions protruding toward the aluminum electrode layer in an interface with the aluminum electrode layer, and the semiconductor device operates under a temperature of 200° C. or more.

2. The semiconductor device according to claim 1, wherein
a degree of hardness of the first copper electrode layer is higher than a degree of hardness of the aluminum electrode layer under a temperature of 200° C.

3. The semiconductor device according to claim 1, wherein
a size of crystal grains of the first copper electrode layer is equal to or smaller than 0.2 μm.

4. The semiconductor device according to claim 1, wherein
the plurality of protruding regions are arranged periodically in two directions perpendicular to each other in a plan view.

5. The semiconductor device according to claim 1, wherein
at least part of the first copper electrode layer of each of the plurality of protruding regions includes aluminum.

6. The semiconductor device according to claim 1, wherein
a depth of each of the plurality of protruding regions is equal to or larger than 0.2 μm and equal to or smaller than 5.0 μm.

7. The semiconductor device according to claim 1, wherein
a width of a base portion of each of the plurality of the protruding regions in a plan view is larger than a size of crystal grains of the first copper electrode layer.

8. The semiconductor device according to claim 1, wherein
a width of a base portion of each of the plurality of the protruding regions in a plan view is equal to or larger than 0.2 μm and equal to or smaller than 1.0 μm.

9. The semiconductor device according to claim 1, wherein
a base portion of each of the plurality of the protruding regions has a circular shape in a plan view.

10. The semiconductor device according to claim 1, wherein
a base portion of each of the plurality of the protruding regions has a slit shape in a plan view.

11. The semiconductor device according to claim 1, wherein
a size of crystal grains of the second copper electrode layer is equal to or larger than 0.5 μm.

12. The semiconductor device according to claim 1, wherein
the wide bandgap semiconductor is any of silicon carbide, nitride, and diamond.

13. The semiconductor device according to claim 1, further comprising:
an electrode joint material; and
a lead electrode, wherein
the lead electrode is joined to an upper surface of the second copper electrode layer by the electrode joint material.

14. The semiconductor device according to claim 1, further comprising
a bonding wire joined to an upper surface of the second copper electrode layer.

15. The semiconductor device according to claim 1, further comprising
an insulating substrate; and
an insulating substrate joint material, wherein
the insulating substrate includes an insulating plate and a conductive plate provided on a surface of the insulating plate, and
the conductive plate is joined, via the insulating substrate joint material, to a surface of the semiconductor element on a side opposite to the side on which the aluminum electrode layer is provided.

16. A method of manufacturing a semiconductor device that operates under a temperature of 200° C. or more, comprising:
an aluminum electrode layer formation process of forming, on an upper surface of a semiconductor element including a wide bandgap semiconductor, an aluminum electrode layer including aluminum as a main component and provided with a plurality of first depression portions in an upper surface of the aluminum electrode layer;
a first copper electrode layer formation process of forming a first copper electrode layer including copper as a main component and including a plurality of protruding regions corresponding to the plurality of first depression portions in a region including the plurality of first depression portions in a plan view on an upper surface of the aluminum electrode layer; and
a second copper electrode layer formation process of forming a second copper electrode layer having crystal grains larger in size than crystal grains of the first copper electrode layer on an upper surface of the first copper electrode layer.

17. The method of manufacturing the semiconductor device according to claim 16, wherein
the aluminum electrode layer formation process includes:
an aluminum electrode layer preparation process of forming, on an upper surface of the semiconductor element, the aluminum electrode layer including aluminum as a main component and provided with a plurality of second depression portions in an upper surface of the aluminum electrode layer; and
a wet etching process of forming the aluminum electrode layer provided with the plurality of first depression portions by wet etching on the plurality of second depression portions as starting points in the aluminum electrode layer.

* * * * *